(12) United States Patent
Dhruvkumar et al.

(10) Patent No.: US 11,664,257 B2
(45) Date of Patent: May 30, 2023

(54) CONTACTLESS WAFER SEPARATOR

(71) Applicant: Intel Corporation, Santa Clara, CA (US)

(72) Inventors: Varshalaxmi Bhatt Dhruvkumar, Kedah (MY); John Biggs, Queen Creek, AZ (US); Shaw Fong Wong, Pulau Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/480,161

(22) Filed: Sep. 21, 2021

(65) Prior Publication Data

US 2022/0005718 A1    Jan. 6, 2022

(51) Int. Cl.
*H01L 21/677*    (2006.01)
*B65G 57/03*    (2006.01)
*B65G 57/00*    (2006.01)

(52) U.S. Cl.
CPC ...... *H01L 21/67781* (2013.01); *B65G 57/005* (2013.01); *B65G 57/03* (2013.01); *H01L 21/67766* (2013.01)

(58) Field of Classification Search
CPC ........ H01L 21/67781; H01L 21/67766; B65G 57/005; B65G 57/03
See application file for complete search history.

(56) References Cited

U.S. PATENT DOCUMENTS

| | | | |
|---|---|---|---|
| 8,912,075 B1 * | 12/2014 | Lei | H01L 21/78 438/464 |
| 10,811,292 B2 * | 10/2020 | Esteron | H01L 21/67356 |
| 10,896,834 B2 * | 1/2021 | Kirkland | H01L 21/6838 |
| 2004/0097053 A1 * | 5/2004 | Yajima | B24B 41/06 438/459 |
| 2007/0284282 A1 * | 12/2007 | Yajima | H01L 21/67346 206/503 |
| 2012/0080832 A1 * | 4/2012 | Woodard | B32B 43/006 428/64.1 |
| 2018/0012767 A1 * | 1/2018 | Aoyama | H01L 21/28176 |
| 2018/0033665 A1 * | 2/2018 | Niederhofer | H01L 21/67781 |

* cited by examiner

*Primary Examiner* — Lynn E Schwenning
(74) *Attorney, Agent, or Firm* — Viering, Jentschura & Partner mbB

(57) ABSTRACT

The present disclosure is directed to a wafer container including: a housing configured for transporting a plurality of wafers, wherein the plurality of wafers are stacked on a base of the housing in a first direction; a plurality of wafer separator rings; each of the wafer separator rings configured to encircle a wafer of the plurality of wafers in a second direction that is substantially perpendicular to the first direction, each of the wafer separator rings including a top surface and a bottom surface, defining a thickness there between extending in the first direction, which is about 0.3 mm-1.4 mm; and each of the wafer separator rings including an inner side wall and an outer side wall defined by an inner diameter and an outer diameter, respectively, in the second direction, wherein the inner diameter of the wafer separator ring is greater than 300 mm and configured to be spaced apart from the wafer it is encircling.

19 Claims, 10 Drawing Sheets

Prior art

CONTACTLESS WAFER SEPARATOR

BACKGROUND

Reducing yield losses during wafer transport has become increasingly important. Among the major defects that may be attributed to the wafer transport are solder bump corrosion and solder bump recognition failure during chip bonding process from contamination, as well as due to "wafer drop excursions" during further processing of the transported wafer. The above described defects are major yield loss factors that may need to be addressed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
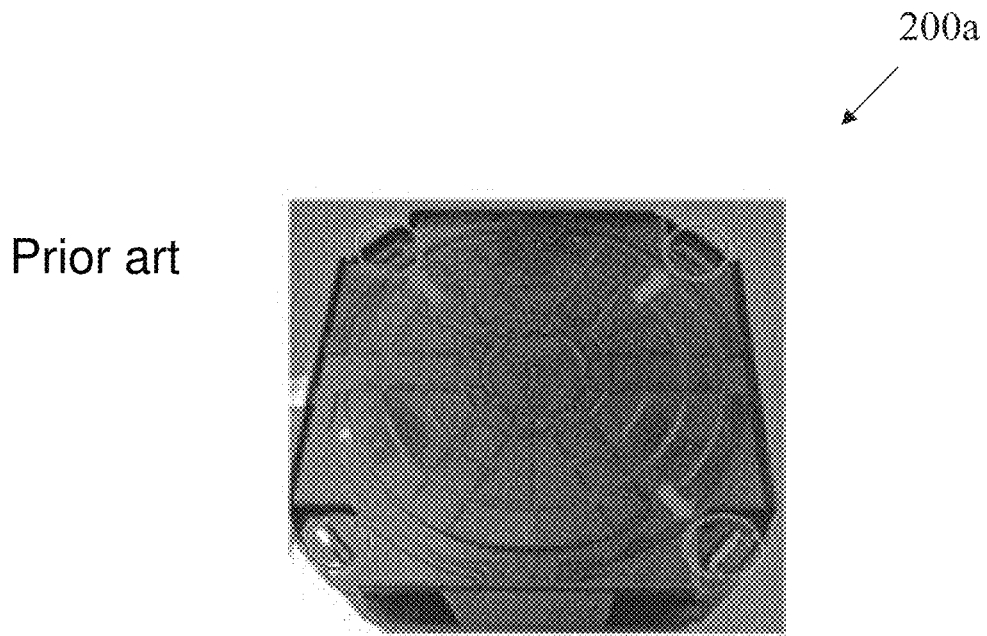
FIG. 1 is a photograph showing a conventional wafer container.
Figure 2:
FIG. 2 schematically shows the stacking of the wafer between interleaves and foam in a conventional wafer container.

Wafers are commonly transported in wafer containers. A commonly used housing 200a of a wafer container is shown in FIG. 1, which may also be termed as a film frame shipper. FIG. 2 shows the common stacking arrangement within such a wafer container. Typically, about 25 wafers 110a are stacked on top of each other in one wafer container, and each wafer is separated from a neighbouring wafer by an interleaf 100a to prevent direct contact between the stacked wafers with each other during shipment. On the bottom and on top of this stacked arrangement may be a foam 140a.

Figure 3:
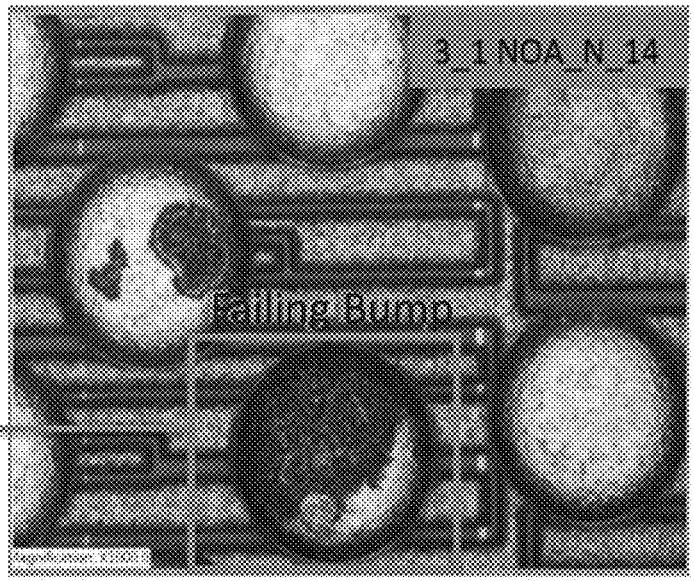
FIG. 3 shows a photograph of a contaminated and failing solder bump (top) and schematically shows the hypothesis causing the contamination of the solder bumps in the conventional wafer container.
Figure 3:
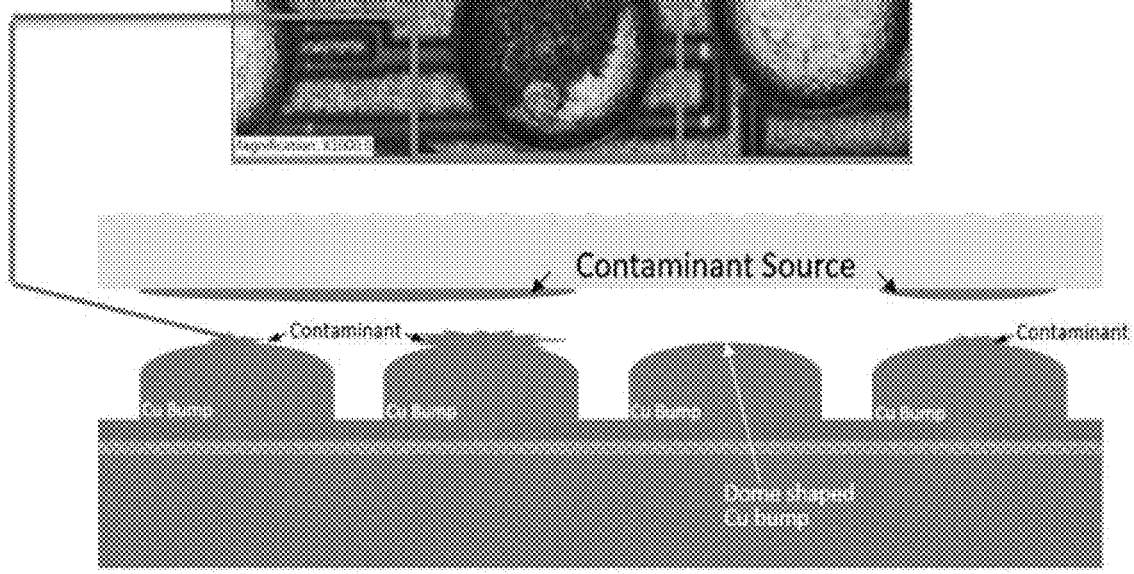

There are many commonly used interleaves that are available to prevent the direct contact between the stacked wafers, including interleaves from companies such as DuPont and Achilles. However, there appear to be disadvantages for the commonly used interleaves as will be discussed herein. One of the interleaves was found to contaminate the solder bumps, a photo of which is shown in FIG. 3. This contamination may be due to a high ionic density of phosphorus (P) and potassium (K) on a coating of the interleaf. Specifically, it was shown in an Energy Dispersive X-Ray (EDX) analysis of the interleaf that the commonly used interleaf contains ionic compounds, for example, atomic P and K.

Figure 4:
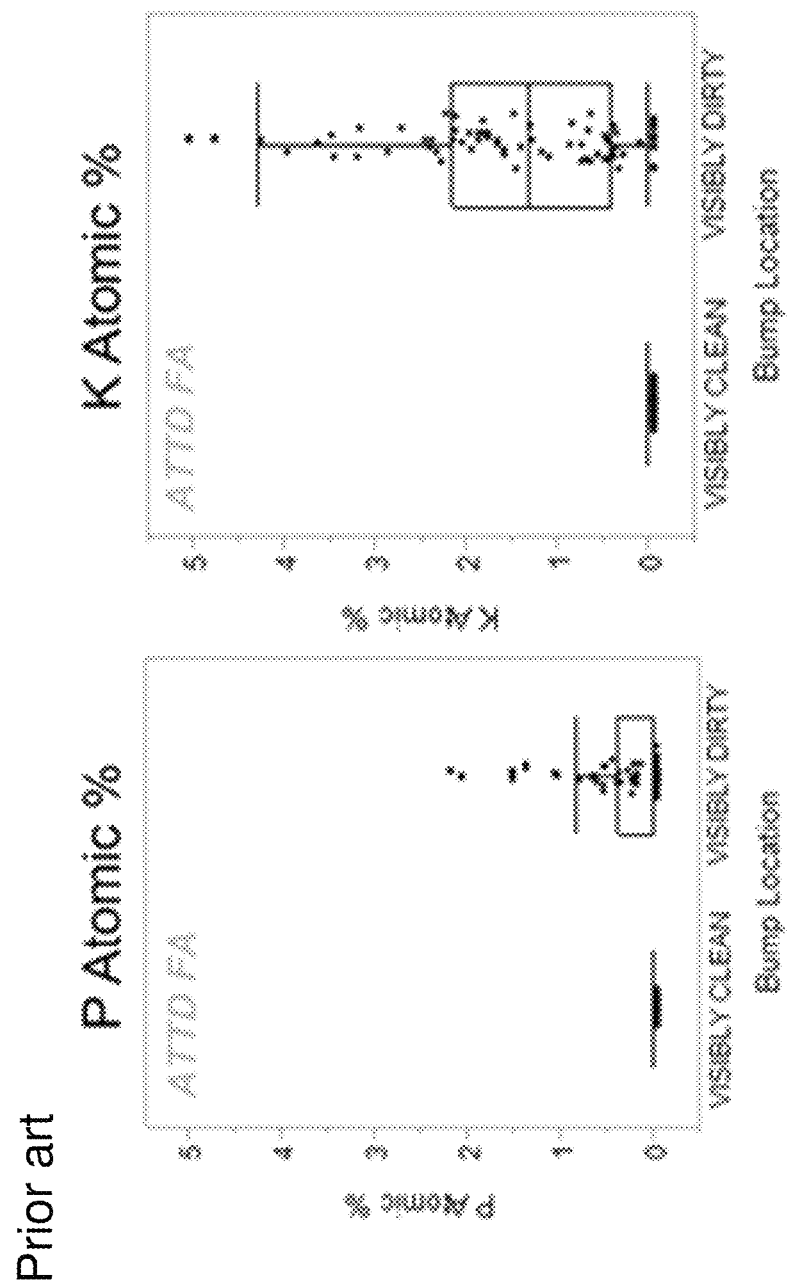
FIG. 4 shows a comparison of the analysed ionic compounds between clean and contaminated solder bumps.

A Scanning Electron Microscopy (SEM)/EDX analysis of the contaminated solder bumps was subsequently used to correlate the elements found on the contaminated solder bumps, thereby concluding that the interleaf caused the contamination on the solder bumps. A comparison between the contaminated (visibly dirty) and clean solder bumps is shown in FIG. 4, indicating that the percentage of both P and K ions, originating from the commonly used interleaves, was much higher for the contaminated (visibly dirty) solder bumps.

Another type of interleaf is made of a non-rigid or paper-like material, such as polyethylene. A disadvantage with this type of interleaf is that it may easily get stuck on the part of the carrier layer, e.g., a polyethylene terephthalate surface, thereby producing folds in the interleaf during the transport. Due to the folds, a vacuum leakage may be caused between the vacuum cup and the support structure of the wafer. During removal of the interleaf, which may be facilitated by a tool camera, the vacuum leakage may cause the tool camera to misinterpret the identification of the interleaf versus wafer. This misinterpretation may cause the tool to execute the wrong action, which results in a "wafer drop excursion" that takes a potentially defect-free wafer out of production, as one other major yield loss factor.

Figure 5A:
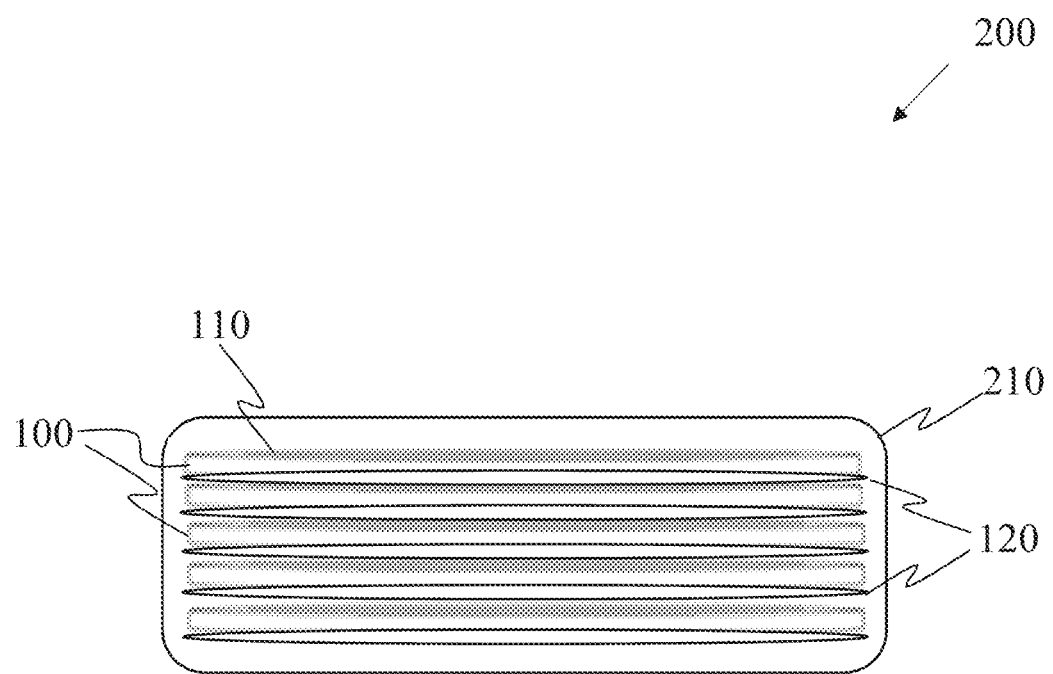
FIG. 5A schematically shows the stacking of the plurality of wafers in accordance with the present disclosure.

To address these shortcomings, in a first aspect, there is disclosed a wafer container 200. As shown in FIG. 5A, the wafer container 200 may include a housing 210 for transporting a plurality of wafers 110, wherein the plurality of wafers 110 are stacked on a base of the housing 210 in a first direction. Each wafer of the plurality of wafers 110 may be disposed on a carrier layer 120 and encircled by a wafer separator ring 100 in a second direction that is substantially perpendicular to the first direction. Each of the wafer separator rings 100 may have a top surface and a bottom surface, defining a thickness there between extending in the first direction, which may be greater than a thickness of the wafer 110 it is encircling.

Figure 5B:
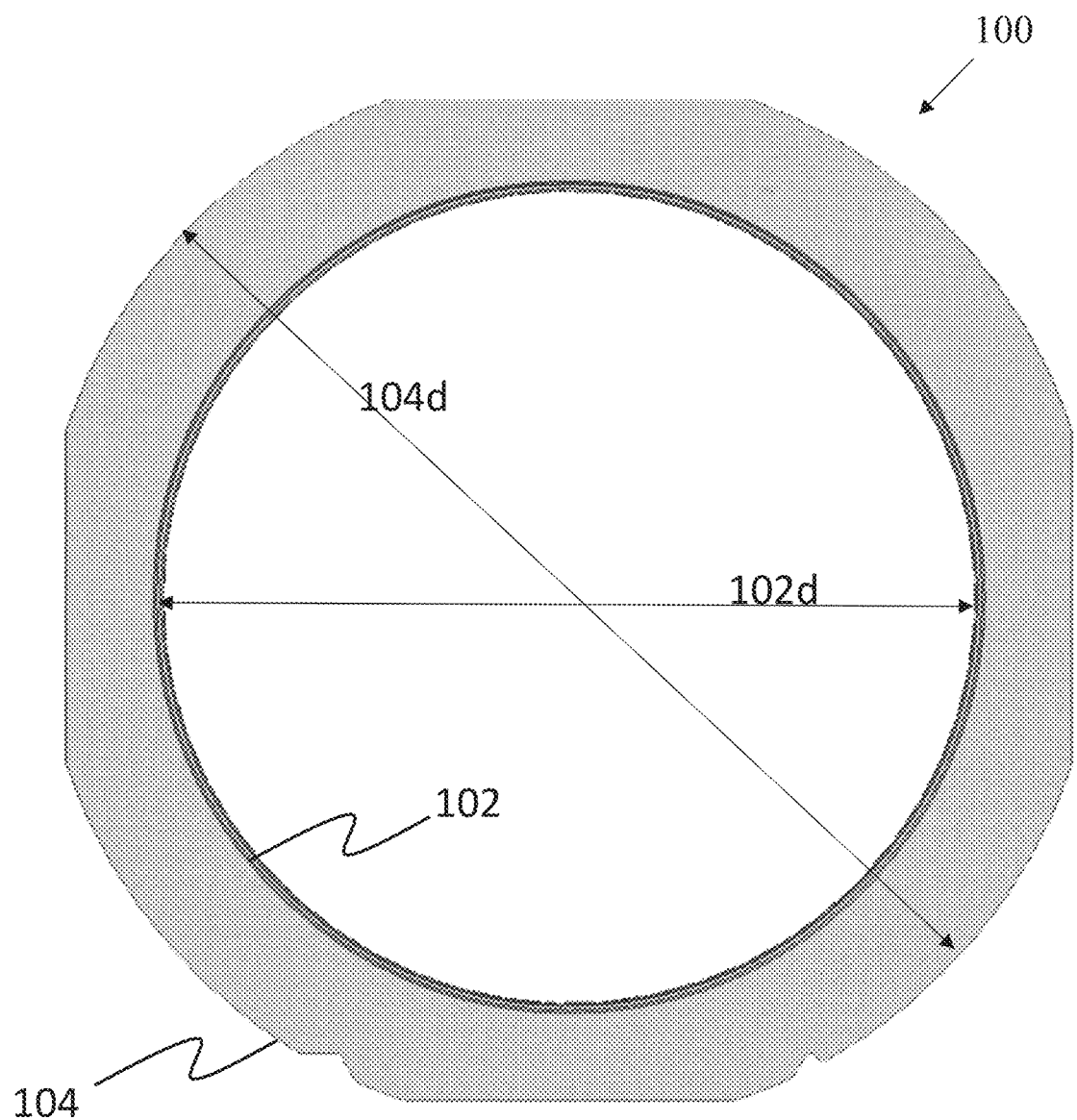
FIG. 5B schematically shows a wafer separator ring in accordance with the present disclosure.

As shown on FIG. 5B, each of the wafer separator rings 100 may have an inner side wall 102 and an outer side wall 104 defined by an inner diameter 102d and an outer diameter 104d, respectively, in the second direction. The inner diameter 102d of the wafer separator ring 100 may be greater than an outer diameter 104d of the wafer such that the wafer separator ring 100 is spaced apart from the wafer 110 it is encircling.

The wafer separator ring 100 of the present disclosure may generally have a ring shape or, in other words, have a form as a circular band with an inner side wall 102 and an outer side wall 104 defined by an inner diameter 102d and an outer diameter 104d, respectively. This shape differs from the commonly used interleaves, which are typically in the shape of a circular sheet that fully covers a wafer. Hence, the shape of the wafer separator ring 100 of the present disclosure, and the dimension requirements that apply to it, may advantageously prevent the wafer separator ring 100 from being in contact with the wafer 110. Since the wafer separator ring 100 is spaced apart from the wafer 110 it is encircling, there is no contamination caused by the wafer separator ring 100 on the wafer 110. Accordingly, by being in the shape of a ring, rather than in the form of a circular sheet, one major yield loss factor resulting from contact between the wafer 110a and the interleaf 100a that was observed in the conventional system, causing contamination or bump corrosion, may be prevented.

The outer diameter 104d may be consistent across the outer side wall 104, or it may have cut-outs as shown in FIG. 5B. The cut-outs may serve to more closely follow the shape of the housing 210.

Figure 6:
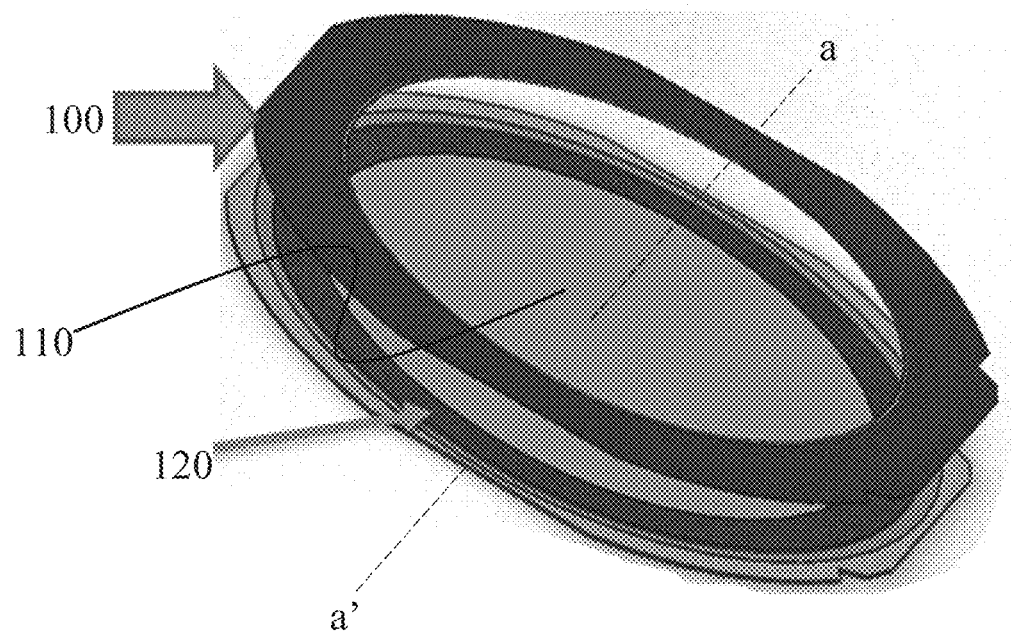
FIG. 6 schematically shows a wafer separator ring together with a wafer and a carrier layer in accordance with the present disclosure.

As shown in FIG. 6, the wafer separator ring 100 may encircle a wafer 110 that is disposed on a carrier layer 120. The carrier layer 120 may have the function of a base layer for the wafer 110. In this disclosure, the carrier layer 120 may also serve to support the wafer separator 100 thereon. Accordingly, both the wafer 110 and the wafer separator ring 100 may be assembled adjacent to each other in the second direction on the carrier layer 120. An outer diameter of the carrier layer may accordingly exceed an outer diameter of the wafer 110, such that the wafer separator ring 100 may be disposed on the remaining part of the carrier layer 120. Accordingly, in various embodiments, the inner diameter 102d of the wafer separator ring 100 may be at least 0.01 mm greater than an outer diameter of the wafer 110.

According to some embodiments, the carrier layer 120 may be made from an adhesive polymer material. The adhesive polymer material may include, or may consist of polyethylene terephthalate.

Advantageously, when the carrier layer 120 includes polyethylene terephthalate, the carrier layer 120 may have the additional function of an adhesive which may assist to retain the wafer 110 in position during transport.

The surface of the wafer separator ring 100 that is shown in FIG. 6 may be referred to as the top surface, while the surface of the wafer separator ring 100 that is obscured from viewing in FIG. 6 may be referred to as the bottom surface. Hence, the top surface of the wafer separator ring 100 may be opposite to the bottom surface. The top surface and the bottom surface refer to the two largest surfaces of the wafer separator ring 100. The distance between the top surface and the bottom surface may be referred to as the thickness of the wafer separator ring 100, and an axis a-a' defining the direction for thickness of the wafer separator ring 100 may be perpendicular to the top surface and the bottom surface. The axis defining the thickness of the wafer separator ring 100 may also extend in the first direction, in which the plurality of wafers are stacked, while the top surface and the bottom surface may extend in the second direction. While the thickness of the wafer separator ring 100 may vary across the wafer separator ring 100, according to some embodiments, a thickness of the wafer separator ring 100 may be about 0.3 mm to about 1.4 mm, or about 0.4 mm to about 1.4 mm, or about 0.6 mm to about 1.0 mm. Advantageously, the range of about 0.4 mm to about 1.4 mm provides a beneficial balance between sufficient thickness to ensure stability of the wafer separator ring 100 and not being too thick, thereby still allowing up to 25 wafers to be transported in one wafer container 200.

According to various embodiments, the wafer separator ring 100 may include a rigid polymer material. Advantageously, a rigid material may be beneficial for avoiding any folds in the material, since it was observed in one of the commonly used interleaves 100a (i.e., sheet interleaves) that such folds may result in the tool camera misinterpreting the wafer versus the interleaf. Hence, since a more rigid material would not cause the folds, another source of major yield loss can be prevented.

In various embodiments, the rigid material may be selected from the group consisting of a rigid polymer, a metal, wood, carbon fiber, and a combination thereof. The rigid polymer may have a tensile Young's modulus value at 25° C. between 500 MPa and 50 GPa. In some embodiments, the tensile Young's modulus value at 25° C. may be between 1 GPa and 50 GPa, or between 2 GPa and 30 GPa. Advantageously, at these ranges of rigidity, the wafer separator ring 100 does not fold during transport.

In some embodiments, the rigid polymer may be selected from the group consisting of poly(methyl methacrylate), polyepoxide, polycarbonate, and combinations thereof. Advantageously, since the wafer separator ring includes these rigid materials, as opposed to materials of less rigidity (e.g., PET or paper), the wafer separator ring 100 does not fold during transport.

Alternatively or additionally, the wafer separator ring may include a material that is recyclable. "Recyclable", in this context, is intended to mean that the same wafer separator ring 100 that has been used for one transport in a wafer container 200 may be kept, cleaned and reused in a subsequent transport of wafers.

The wafer separator ring 100 of the present disclosure may save on weight compared to a common thick interleaf by being in the shape of a ring, instead of being a full circular sheet, and therefore including less volume that could contribute to weight, and may therefore be considered of light weight. Another contributing factor for saving on weight may be the material of the wafer separator ring 100. Accordingly, the wafer separator ring 100 may be, or include a material that is of a light weight. The density of the material may, for example, be in the range of less than 5 g/cm$^3$, or less than 3 g/cm$^3$, and preferably in the range of about 1 to 2 g/cm$^3$. Due to this density range, the material may be sufficiently light weight such that the loaded wafer container 200 is not too heavy. In one example, the wafer separator ring 100 may include, or substantially consist of a rigid polymer that is polycarbonate.

Figure 7:
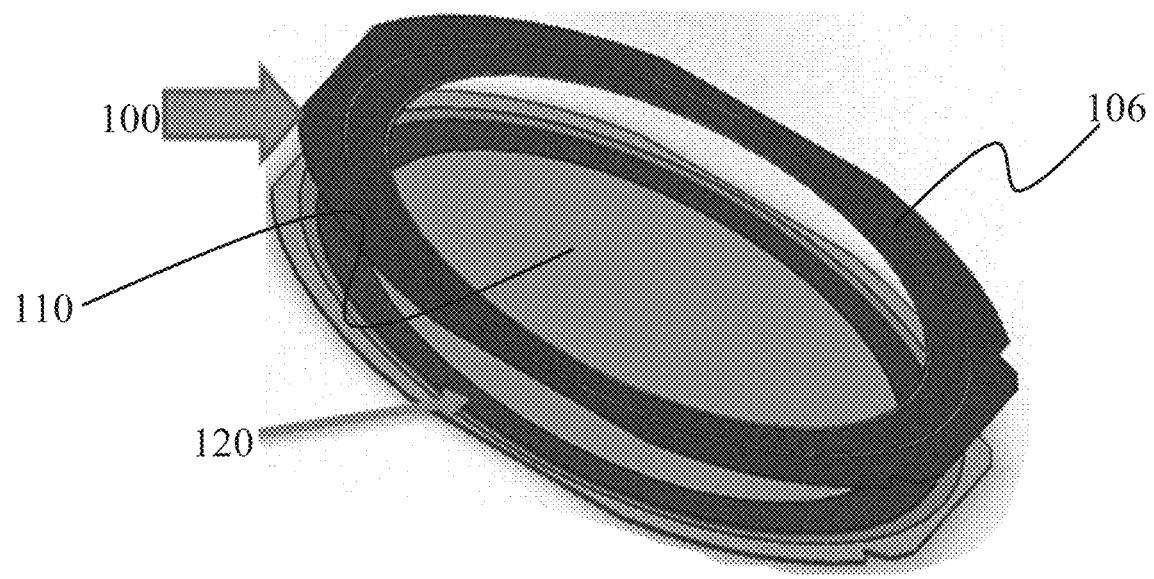
FIG. 7 schematically shows a wafer separator ring including at least one ridge and together with a wafer and a carrier layer in accordance with the present disclosure.

As shown in FIG. 7, according to some embodiments, at least one ridge 106 may be positioned on the wafer separator ring 100. Advantageously, the at least one ridge 106 may add support and decrease compression of the wafer separator ring 100 when the plurality of wafers 110 are stacked. The at least one ridge 106 may also help to protect the region of the carrier layer 120 that is exposed to the wafer separator ring 100 from coming into contact with an adjacent wafer 110 on the top surface of the wafer separator ring 100.

The at least one ridge 106 may be an elevated portion protruding from the wafer separator ring 100. The at least one ridge 106 may protrude from the top surface and additionally or alternatively from the bottom surface. Hence, the at least one ridge 106 may protrude in the first direction. While the at least one ridge 106 may have any shape, in one embodiment, the ridge may be a circular protrusion substantially parallel to the inner side wall or the outer side wall 102, 104 of the wafer separator ring 100. A height of the at least one ridge 106 measured in the first direction may be about 0.3 mm to about 0.6 mm, or about 0.5 mm to about 0.6 mm. In case the at least one ridge is present, this height may contribute to the thickness of the wafer separator ring 100. In other words, the thickness of the wafer separator ring 100 in the first direction including the ridge may be about 0.3 mm to about 1.4 mm. In some embodiments, a total thickness of the wafer separator ring 100 may be two to three times, or 2.5 times, as much as the height of the at least one ridge 106. For example, if the height of the ridge 106 is 0.56 mm, then the thickness of the wafer separator ring 100 may be about 1.4 mm.

Figure 8:
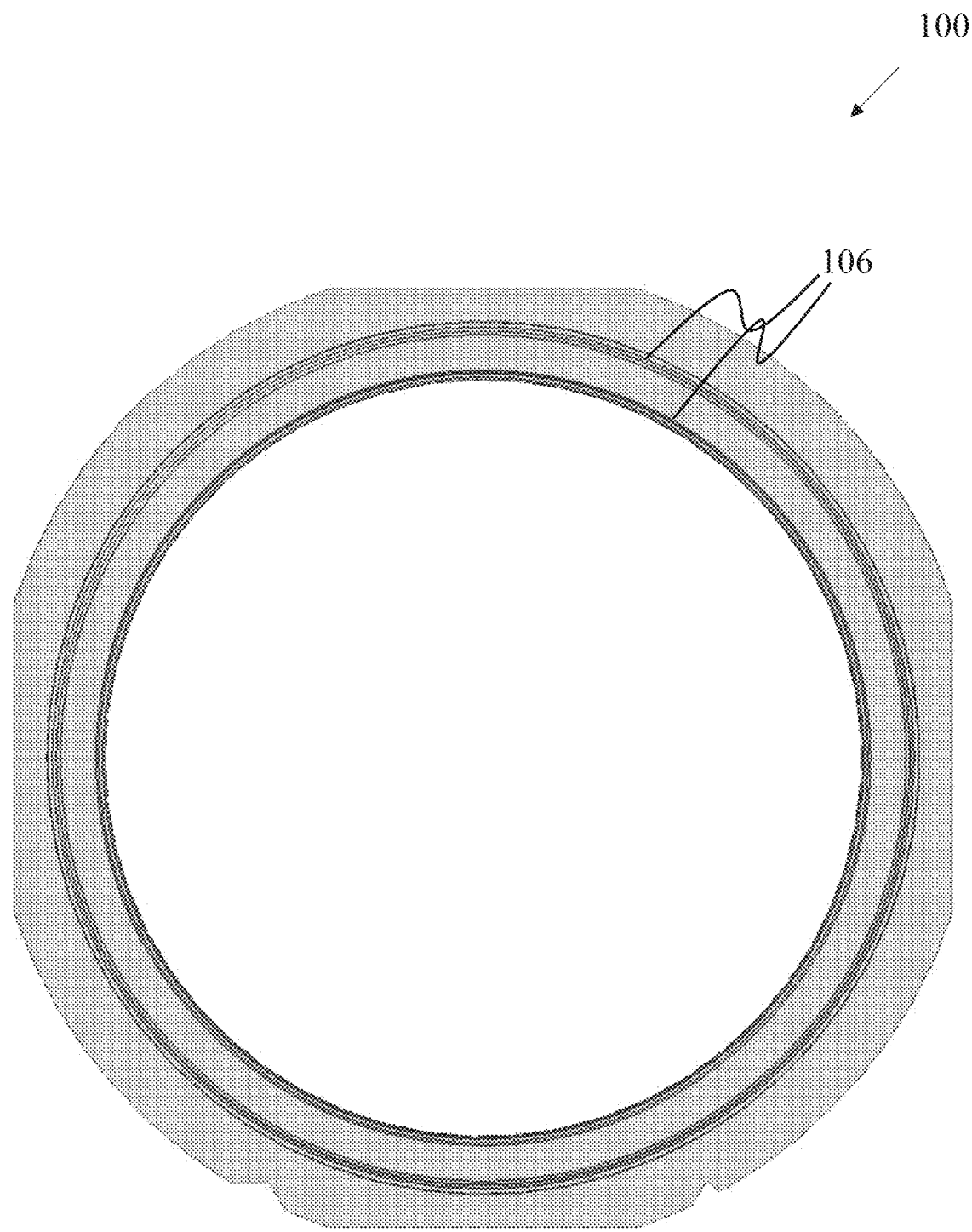
FIG. 8 schematically shows a wafer separator ring including at least one ridge in accordance with the present disclosure (top view)

As shown in FIG. 8, there may be a plurality of ridges 106 positioned along both the inner side wall 102 and towards the outer side wall 104, for example, two, three, four, or more than four ridges. The ridges 106 may also assist in deflection any deflection (i.e. change of form) of the wafer separator ring 100 when a weight is applied on the wafer separator ring 100.

Figure 9:
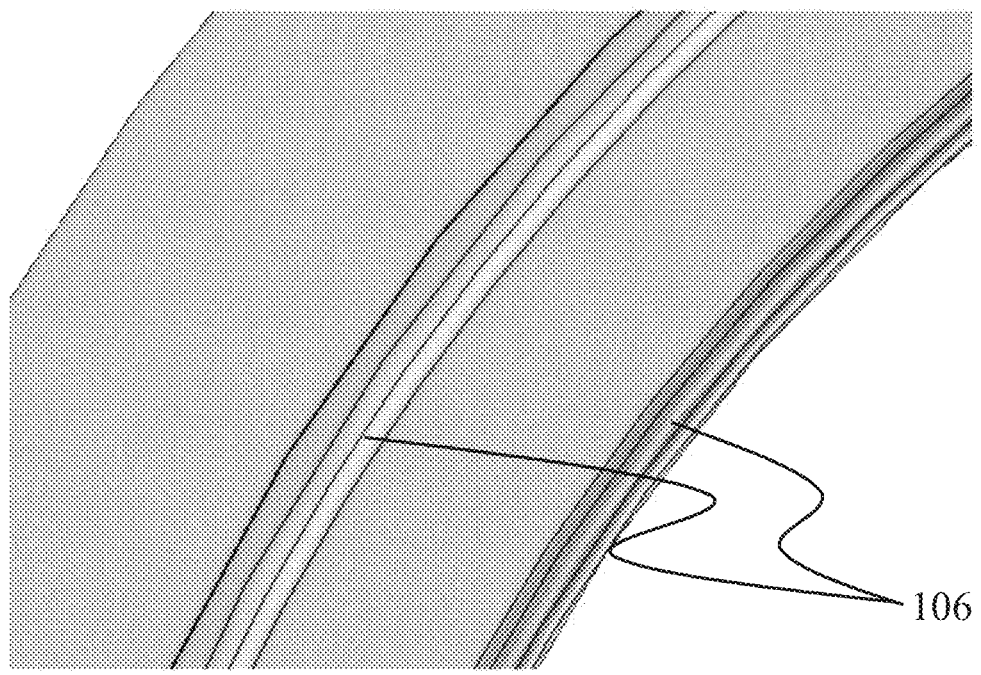
FIG. 9 schematically shows an enlargement of a wafer separator ring including at least one ridge in accordance with the present disclosure (top view)

While the ridges 106 may be placed anywhere on the wafer separator ring 100, according to some embodiments and as shown in FIG. 9, the at least one ridge 106 may be positioned along the inner side wall 102 of the wafer separator ring 100. Additionally or alternatively, the at least one ridge 106 may be positioned along a middle section of the wafer separator ring 100, and extend towards the outer side wall 104 of the wafer separator ring 100.

Since the boundaries and side walls of the wafer separator ring 100 are the weaker areas of the wafer separator ring 100, placing the wafer separator ring 100 on either the inner side wall 102 or along a middle section and towards the outer side wall 104 of the wafer separator ring 100 may assist to provide the biggest support to the stability of the wafer separator ring 100.

More advantageously, when placed on the bottom surface of the wafer separator ring 100, the ridges 106 may minimize the contact area between the carrier layer 120 and the wafer separator ring 100. Since the carrier layer 120 may be adhesive, minimizing the contact area between the carrier layer 120 and the wafer separator ring 100 may therefore assist to prevent the wafer separator ring 100 from sticking to the carrier layer 120.

Figure 10:
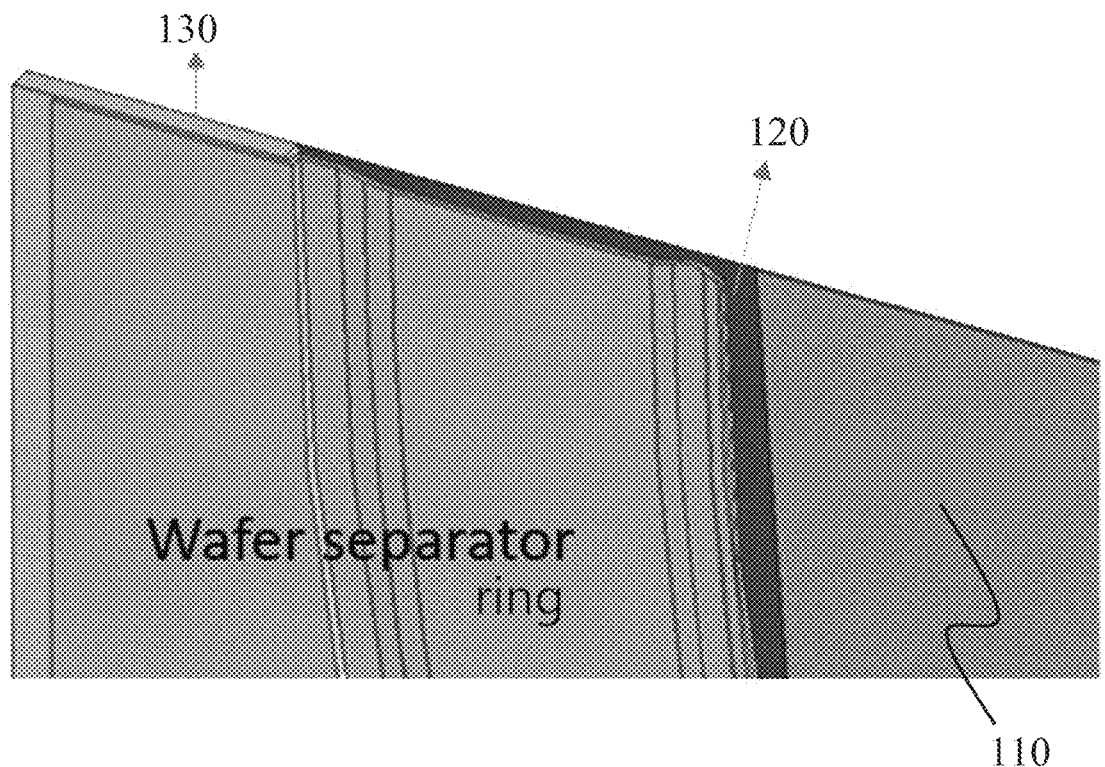
FIG. 10 schematically shows an enlargement of a wafer separator ring including at least one ridge, a support ring and a wafer on a carrier layer in accordance with the present disclosure (top view)
Figure 11:
FIG. 11 shows a side view of the wafer separator ring.

As shown in FIG. 10, in another aspect, the wafer container 200 may further include at least one support ring 130 supporting the carrier layer 120. The at least one support ring 130 may have the function to hold the carrier layer 120 in place. The support ring 130 may have an inner diameter that is greater than, the inner diameter 102d of the wafer separator ring 100 (as shown in FIG. 5B). Additionally or alternatively, the support ring 130 may have an outer diameter that is at least as great as, or greater than, the outer diameter 104d of the wafer separator ring 100 (as shown in FIG. 5B), respectively. The wafer separator ring 100 may overlay on the support ring 130 in the first direction such that the wafer separator ring 100 is not only in contact with the carrier layer 120, but also, at a greater diameter thereof, in contact with, or on top of, the support ring 130. Advantageously, when the wafer separator ring 100 covers (or overlays) the support ring 130, the support ring 130 may not come into direct contact with another support ring 130 stacked above it during shipment, which may help to prevent unnecessary debris from two support rings 130 touching each other.

The support ring 130 may include, or be made of a rigid material. For example, the support ring 130 may be made of a material selected from the group consisting of metal, wood, rigid polymer, carbon, and a combination thereof. In some embodiments, the support ring may be made of a metal.

Each wafer of the plurality of wafers 110 may include a plurality of dies. The plurality of dies may include solder bumps that are disposed on the plurality of dies. The thickness of each of the wafers of the plurality of wafers including solder bumps may be about 300 to about 900 micrometer, or about 500 to about 800 micrometer, or about 700 to about 780 micrometer. According to some embodiments, the wafer separator ring 100 may be stacked together with the wafer 110 such that the wafer separator ring 100 is elevated over a top surface of the wafer 110 including the solder bumps. Hence, direct contact between the wafers 110 including the solder bumps can be avoided by using the disclosed wafer separator ring 100.

Further dimensions of the wafer separator ring 100 may be adapted to correspond to the housing 210 of the wafer container 200, an example of which may be the cut-outs shown in FIG. 5B.

Figure 12:
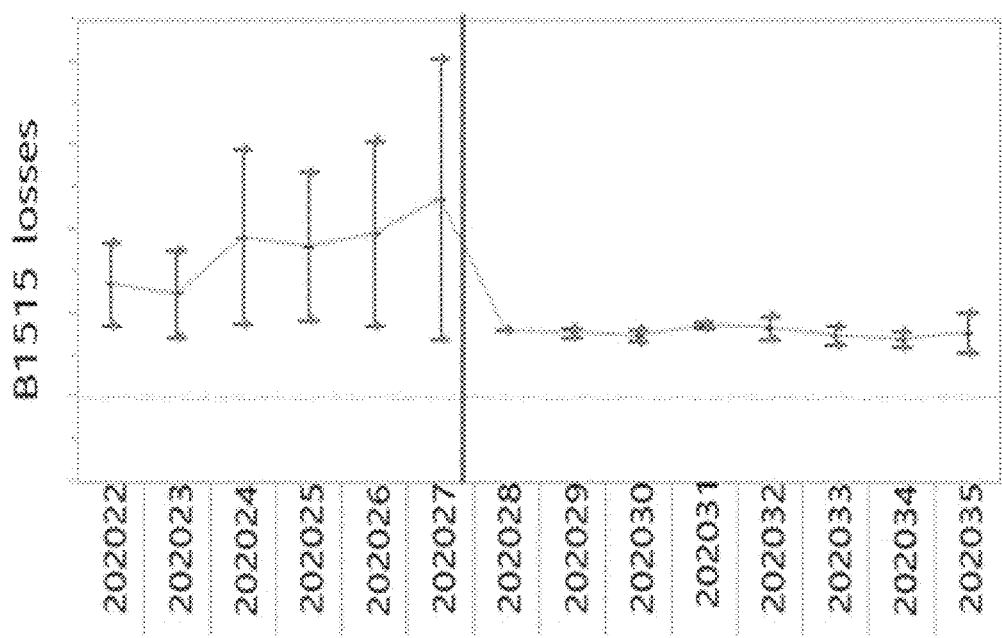
FIG. 12 shows a comparison of the yield loss (the number of losses observed in the shipment) for a wafer container in accordance with the present disclosure with the yield loss before the wafer container produced in accordance with the present disclosure was used; illustrating that the introduction of the wafer container in accordance with the present disclosure resulted in a yield loss improvement of 3%.

As illustrated in FIG. 12, by using the wafer container 200 in accordance with the present disclosure, a yield loss improvement of 3% was achieved. The x-axis shows an example of occurrences of wafer transports while the y-axis shows the yield loss for each of the wafer transports. The conventional interleaves were used up to the point indicated with "202027" on the x-axis, and subsequent wafer transports using the wafer container according to the invention are shown further to the right of the x-axis. A sharp drop in yield loss was observed, indicating the efficiency of the wafer container in reducing yield loss during wafer transport.

In a further aspect, there is provided a wafer separator ring 100. The wafer separator ring 100 may be configured to separate a wafer 110 in a plurality of wafers from its adjacent wafer 110 in a wafer container 200. The wafer separator ring 100 may have a top surface and a bottom surface defining a thickness there between extending in the first direction. The wafer separator ring 100 may be configured to encircle each wafer 110 in a second direction that is substantially perpendicular to the first direction. The thickness of the wafer separator ring 100 may be greater than a thickness of the wafer 110 it is encircling. The wafer separator ring 100 may have an inner side wall 102 and an outer side wall 104 defined by an inner diameter 102d and an outer diameter 104d in the second direction, respectively. The inner diameter 102d of the wafer separator ring 100 may be greater than an outer diameter of the wafer 100 such that the wafer separator ring 110 is spaced apart from the wafer it is encircling.

While the dimensions of the wafer separator ring 100 may be adapted to correspond to a housing of the wafer container, an inner diameter 102d of the wafer separator ring 100 may be greater than 300 mm, or about 300 mm to about 400 mm, or about 300 mm to about 350 mm, or about 300 mm to about 310 mm.

Further aspects of the disclosure and advantages described for the wafer container 200 of the previous aspect can be analogously valid for the wafer housing separator of the second aspect, and vice versa. As the various features, material properties and advantages have already been described above and in the examples demonstrated herein, they shall not be iterated for brevity where possible.

In a further aspect, there is disclosed a method for stacking wafers. The method may include providing a wafer container 200 for housing a plurality of wafers 110. The plurality of wafers 110 may be stacked on a base of a housing 200 in a first direction. The method may further include disposing each of the plurality of wafers 110 on a carrier layer 120. The method may further include encircling each wafer of the plurality of wafers 110 disposed on the carrier layer 120 by a wafer separator ring 100 in a second direction that is substantially perpendicular to the first direction. Each of the wafer separator rings 100 may have a top surface and a bottom surface defining a thickness there between extending in the first direction, which is greater than a thickness of the wafer 110 it is encircling. Each of the wafer separator rings 100 may have an inner side wall 102 and an outer side wall 104 defined by an inner diameter 102d and an outer diameter 104d in the second direction, respectively. The inner diameter 102d of the wafer separator ring 100 may be greater than an outer diameter of the wafer 110 such that the wafer separator ring 100 is spaced apart from the wafer it is encircling.

In some embodiments, the wafer separator ring 100 of the method may include a rigid material, for example, a polycarbonate. Due to the rigidity of the material, the method allows that the placement of the wafer separator ring 100 on the carrier layer 120 may be carried out by a robotic arm, which may benefit in automating the method of transporting the wafer 110.

The stacking of the plurality of wafers may further include positioning a top wafer on a second ridge of a bottom wafer. Specifically, the second ridge may be protruding from the top surface of the bottom wafer and a wafer that is stacked above that bottom wafer may be positioned on the ridge that is protruding from the top surface of the bottom wafer.

For the removal of the wafer separator ring 100 after transport, and due to the shape of the wafer separator ring 100 having an inner cavity, it is advantageously possible to use relatively smaller tools for the removal of the wafer separator ring 100 from the carrier layer 120. The term "tool" is hereby used in contrast to a larger apparatus, such as, e.g., a robot arm extension. For example, since the wafer separator ring 100 has an inner cavity, sufficient space is provided for a tool to pick up and separate the wafer separator ring 100 from the carrier layer 120, which may not be feasible with a conventional interleaf 100a.

Further aspects of the disclosure and advantages described for the wafer container of the first aspect can be analogously valid for the method for stacking wafers of the third aspect, and vice versa. As the various features, material properties and advantages have already been described above and in the examples demonstrated herein, they shall not be iterated for brevity where possible.

In a first example, there is provided a wafer container including: a housing configured for transporting a plurality of wafers, wherein the plurality of wafers are stacked on a base of the housing in a first direction; a plurality of wafer separator rings; each of the wafer separator rings configured to encircle a wafer of the plurality of wafers in a second direction that is substantially perpendicular to the first direction, each of the wafer separator rings including a top surface and a bottom surface, defining a thickness there between extending in the first direction, which is about 0.3 mm-1.4 mm; and each of the wafer separator rings including an inner side wall and an outer side wall defined by an inner diameter and an outer diameter, respectively, in the second direction, wherein the inner diameter of the wafer separator ring is greater than 300 mm and configured to be spaced apart from the wafer it is encircling.

In a second example, the wafer separator ring may include a rigid polymer material.

In a third example, the rigid polymer material may include polycarbonate.

In a fourth example, the wafer container may further include at least one ridge positioned on the wafer separator ring.

In a fifth example, the at least one ridge may be positioned along the inner side wall of the wafer separator ring.

In a sixth example, the at least one ridge may be positioned along the outer side wall of the wafer separator ring.

In a seventh example, the at least one ridge may be positioned along the inner side wall of the wafer separator ring and at least one other ridge may be positioned along the outer side wall of the wafer separator ring.

In an eighth example, the inner diameter of the wafer separator ring may be at least 0.01 mm greater than an outer diameter of the wafer it is encircling.

In a ninth example, the wafer container may further include the plurality of wafers.

In a tenth example, the wafer container may further include at least one support ring supporting the carrier layer, the support ring including an inner diameter that is greater than the inner diameter of the wafer separator ring and an outer diameter that is at least as great as, or greater than, the outer diameter of the wafer separator ring.

In an eleventh example, the support ring may include a metal material.

In a twelfth example, each wafer of the plurality of wafers may include a plurality of dies with solder bumps disposed on the plurality of dies.

In a thirteenth example, the wafer container may further include a plurality of carrier layers, wherein each wafer of the plurality of wafers is configured to be disposed on each of the carrier layer.

In a fourteenth example, the carrier layer may include an adhesive polymer material.

In a fifteenth example, the adhesive polymer material may include polyethylene terephthalate.

In a sixteenth example, there is provided a wafer separator ring including a top surface and a bottom surface defining a thickness there between extending in a first direction, at least one ridge positioned thereon, wherein the wafer separator ring is configured to encircle a wafer in a second direction that is substantially perpendicular to the first direction, wherein the thickness of the wafer separator ring is about 0.3 mm-1.4 mm; and the wafer separator ring including an inner side wall and an outer side wall defined by an inner diameter and an outer diameter in the second direction, respectively, wherein the inner diameter of the wafer separator ring is greater than is greater than 300 mm.

In a seventeenth example, the wafer separator ring may include a rigid polymer material.

In an eighteenth example, the rigid polymer material may include polycarbonate.

In a nineteenth example, there is provided a method for stacking wafers including: providing a wafer container for housing a plurality of wafers, wherein the plurality of wafers are stacked in a first direction; disposing each of the plurality of wafers on a carrier layer; providing a wafer separator ring encircling each wafer of the plurality of wafers, wherein the wafer separator ring includes: a top surface and a bottom surface defining a thickness there between extending in the first direction, which is greater than a thickness of the wafer it is encircling, at least one ridge positioned thereon; and an inner side wall and an outer side wall defined by an inner diameter and an outer diameter in the second direction, respectively, wherein the inner diameter of the wafer separator ring is greater than an outer diameter of the wafer such that the wafer separator ring is spaced apart from the wafer it is encircling.

In a twentieth example, the stacking of the plurality of wafers further includes positioning a top wafer on a second ridge of a bottom wafer.

The dimensions of the wafer separator ring and the choice of materials presented above are intended to be exemplary for forming the separating the wafers. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. A wafer container comprising:
a housing configured for transporting a plurality of wafers, wherein the plurality of wafers are stacked on a base of the housing in a first direction;
a plurality of wafer separator rings;
wherein each of the plurality of wafer separator rings is configured to encircle a wafer of the plurality of wafers in a second direction that is substantially perpendicular to the first direction;
wherein each of the plurality of wafer separator rings comprises a top surface and a bottom surface, defining a thickness there between extending in the first direction, which is about 0.3 mm-1.4 mm; and
each of the plurality of wafer separator rings comprises an inner side wall and an outer side wall defined by an inner diameter and an outer diameter, respectively, in the second direction;
wherein the inner diameter of each of the wafer separator rings is greater than 300 mm and configured to be spaced apart from the wafer it is encircling; and
wherein at least one ridge is positioned on the inner side wall of each of the plurality of wafer separator rings.

2. The wafer container of claim 1, wherein the plurality of wafer separator rings comprise a rigid polymer material.

3. The wafer container of claim 2, wherein the rigid polymer material comprises polycarbonate.

4. The wafer container of claim 1, wherein each of the plurality of wafer separator rings further comprises at least one ridge positioned along the top surface of the wafer separator ring.

5. The wafer container of claim 1, wherein a first ridge is positioned along the inner side wall of each of the plurality of wafer separator rings and a second ridge is positioned along the top surface of each of the plurality of wafer separator rings.

6. The wafer container of claim 1, wherein the inner diameter of each of the plurality of wafer separator rings is at least 0.01 mm greater than an outer diameter of the wafer it is encircling.

7. The wafer container of claim 1, further comprising the plurality of wafers.

8. The wafer container of claim 7, wherein each wafer of the plurality of wafers comprises a plurality of dies with solder bumps disposed on the plurality of dies.

9. The wafer container of claim 1, further comprising a carrier layer and at least one support ring supporting the carrier layer, the support ring comprising an inner diameter that is greater than the inner diameter of the plurality of wafer separator rings and an outer diameter that is at least as great as, or greater than, the outer diameter of the plurality of wafer separator rings.

10. The wafer container of claim 9, wherein the support ring comprises a metal material.

11. The wafer container of claim 1, further comprising a plurality of carrier layers, wherein each wafer of the plurality of wafers is configured to be disposed on each of the plurality of carrier layers.

12. The wafer container of claim 11, wherein the carrier layer comprises an adhesive material.

13. The wafer container of claim 12, wherein the adhesive material comprises polyethylene terephthalate material.

14. The wafer container of claim 1, wherein the top surface or the bottom surface comprises one or more ridges.

15. A wafer separator ring comprising:
a top surface and a bottom surface defining a thickness there between extending in a first direction;
at least one ridge positioned thereon;
wherein the wafer separator ring is configured to encircle a wafer in a second direction that is substantially perpendicular to the first direction;
wherein the thickness of the wafer separator ring is about 0.3 mm-1.4 mm; and
the wafer separator ring comprises an inner side wall and an outer side wall defined by an inner diameter and an outer diameter in the second direction, respectively;
wherein at least one ridge is positioned on the inner side wall; and
wherein the inner diameter of the wafer separator ring is greater than 300 mm.

16. The wafer separator ring of claim 15, wherein the wafer separator ring comprises a rigid polymer material.

17. The wafer container of claim 16, wherein the rigid polymer material comprises polycarbonate.

18. A method for stacking wafers comprising:
providing a wafer container for housing a plurality of wafers, wherein the plurality of wafers are stacked in a first direction;
disposing each of the plurality of wafers on a carrier layer;
providing a wafer separator ring encircling each wafer of the plurality of wafers,
wherein the wafer separator ring comprises:
a top surface and a bottom surface defining a thickness there between extending in the first direction, which is greater than a thickness of the wafer it is encircling;
an inner side wall and an outer side wall defined by an inner diameter and an outer diameter in the second direction, respectively; and
at least one ridge positioned on the inner side wall;

wherein the inner diameter of the wafer separator ring is greater than an outer diameter of the wafer such that the wafer separator ring is spaced apart from the wafer it is encircling.

19. The method claim 18, the stacking of the plurality of wafers further comprising positioning a top wafer on a second ridge of a bottom wafer separator ring.

\* \* \* \* \*